United States Patent [19]

Banholzer et al.

[11] Patent Number: 5,360,479
[45] Date of Patent: Nov. 1, 1994

[54] ISOTOPICALLY PURE SINGLE CRYSTAL EPITAXIAL DIAMOND FILMS AND THEIR PREPARATION

[75] Inventors: William F. Banholzer, Scotia; Thomas R. Anthony, Schenectady, both of N.Y.; Dennis M. Williams, Dublin, Ohio

[73] Assignee: General Electric Company, Worthington, Ohio

[21] Appl. No.: 547,651

[22] Filed: Jul. 2, 1990

[51] Int. Cl.$^5$ .............................................. C30B 29/04
[52] U.S. Cl. ...................................... 117/84; 117/929
[58] Field of Search ................ 423/446; 156/610, 613, 156/614, DIG. 68

[56] References Cited

U.S. PATENT DOCUMENTS

| | | | |
|---|---|---|---|
| 3,895,313 | 7/1974 | Seitz | 372/35 |
| 4,434,188 | 2/1984 | Kamo et al. | 423/446 |
| 4,749,587 | 6/1988 | Bergmann et al. | 427/37 |
| 4,816,286 | 3/1989 | Hirose | 423/446 |

FOREIGN PATENT DOCUMENTS

| | | | |
|---|---|---|---|
| 0206820 | 12/1986 | European Pat. Off. | 423/446 |
| 0118694A | 6/1985 | Japan . | |

OTHER PUBLICATIONS

"Rapid growth of single–crystal diamond on diamond, substrates"; Exp. Solid State Phys. Ill Univ.; Janssen et al; Surf Coat Techol., 47(1-3), 113–26.

"Vapor Growth of Diamond on Diamond and Other Surfaces"; Spitsyn et al.; *Journal of Crystal Growth* 52 (1981); pp. 219–226.

"The barrier height of Schottky diodes with a chemical–vapor–deposited diamond base"; Hicks et al., Penn State Uinv., (Oct. 1988), pp. 2139–2141; J. Appl. Phys. 65(5) (1989).

*Isotopic Enhancement of Thermal Conductivity and Damage Thesholds in Diamond;* Seitz; Harvard Univ. pp. 1–4 (Feb. 1989).

*Primary Examiner*—R. Bruce Breneman
*Assistant Examiner*—Felisa Garrett

[57] ABSTRACT

The present invention is directed to the production of single-crystal diamond consisting of isotopically pure carbon-12 or carbon-13. The product is believed to be like that diamond product in application Ser. No. 448,469, but is made by a different method. In the present invention, isotopically pure single-crystal diamond is grown on a single crystal substrate directly from isotopically pure carbon-12 or carbon-13. One method for forming isotopically pure single-crystal diamond comprises the steps of placing in a reaction chamber a single crystal substrate heated to an elevated CVD diamond-forming temperature. A gaseous mixture of hydrogen and a hydrocarbon of isotopically pure carbon-12 or carbon-13 is provided in the chamber. The gaseous mixture then is at least partially decomposed in the chamber to form an isotopically-pure single crystal diamond layer on the single crystal substrate disposed therein. The thus-formed isotopically-pure single crystal diamond layer optionally may be removed from the single crystal substrate. Another method for forming isotopically-pure single-crystal diamond comprises diffusing isotopically-pure carbon-12 or carbon-13 through a metallic catalyst/solvent under high pressure to a region containing a single crystal substrate to form an isotopically-pure single-crystal diamond layer on said single crystal substrate. The single crystal substrate is stable under the high pressure and elevated temperatures used during the diffusion process. The single crystal substrates optionally may be diamond, including the isotopically-pure single-crystal diamond films formed by the inventive method disclosed herein, thus forming multi-layered diamond structures.

12 Claims, No Drawings

ISOTOPICALLY PURE SINGLE CRYSTAL EPITAXIAL DIAMOND FILMS AND THEIR PREPARATION

CROSS-REFERENCE TO RELATED APPLICATION

This application is cross-referenced to commonly-assigned application Ser. No. 448,469, filed Dec. 11, 1989, the disclosure of which is expressly incorporated herein by reference.

BACKGROUND OF THE INVENTION

The present invention relates to the preparation of single-crystal diamond films and more particularly to such films of isotopically pure diamond.

High thermal conductivity diamond, such as type IIA natural diamond, is characterized by a very high degree of purity and is reported to have a thermal conductivity at 25° C. (298° K.) on the order of about 21 watts/cm°K. Such high thermal conductivity diamond is useful as a heat sink material, such as in the backing of semi-conductors.

Despite its high costs, natural type IIA diamond has been employed as a heat sink material because it has the highest known thermal conductivity. Conventionally-produced high pressure/high temperature synthetic gem diamond can be produced with a similarly high thermal conductivity. For the most part, diamond prepared by low-pressure chemical vapor deposition (CVD) processes are not single crystal diamond and have materially lower thermal conductivities, typically in the order of 12 watts/cm°K. at about 300° K. (hereinafter sometimes referred to as "room temperature conductivity"). Recently, however, the growth of single crystal epitaxial polycrystalline CVD diamond for semi-conductors has been developed as reported in commonly-owned application Ser. No. 479,486, filed Feb. 13, 1990, the disclosure of which is expressly incorporated herein by reference.

U.S. Pat. No. 3,895,313 discloses various diamond materials which allegedly have high thermal conductivities and which allegedly are useful as optical elements for very high-power laser beams. In particular, this citation states that synthetic diamonds grown from isotopically pure carbon-12 or carbon-13 would be useful in this way, with room temperature conductivity values in the range of 10–20 watts/cm°K. being mentioned. However, no methods for the preparation of such diamond are suggested.

Commonly-assigned application Ser. No. 448,469 discloses a method for preparing single crystal diamond of very high chemical and isotopic purity by depositing a layer of diamond on a substrate by chemical vapor deposition methodology using a feed mixture of hydrogen and a hydrocarbon containing isotopically pure carbon-12 or carbon-13. The thus-deposited diamond layer is removed from the substrate. The diamond is converted to single-crystal diamond by diffusion under high pressure through a metallic catalyst/solvent to a region containing a diamond seed crystal. This citation reports the production of single crystal 0.95 carat diamond which analyzed to 99.93% carbon being the C-12 isotope when made from methane having an isotope distribution of 99.96% C-12 and 0.04% C-13. The room temperature conductivity of this single crystal product is reported at 31.5 watt/cm°K.

BROAD STATEMENT OF THE INVENTION

The present invention is directed to the production of single-crystal diamond consisting of isotopically pure carbon-12 or carbon-13. The product is believed to be like that diamond product in application Ser. No. 448,469, but is made by a different method. In the present invention, isotopically pure single-crystal diamond is grown on a single crystal substrate directly from isotopically pure carbon-12 or carbon-13. One method for forming isotopically pure single-crystal diamond comprises the steps of placing in a reaction chamber a single crystal substrate heated to an elevated CVD diamond-forming temperature. A gaseous mixture of hydrogen and a hydrocarbon of isotopically pure carbon-12 or carbon-13 is provided in the chamber. The gaseous mixture then is at least partially decomposed in the chamber to form an isotopically-pure single crystal diamond layer on the single crystal substrate disposed therein. The thus-formed isotopically-pure single crystal diamond layer optionally may be removed from the single crystal substrate.

Another method for forming isotopically-pure single-crystal diamond involves a chemical transport process wherein graphite and hydrogen are placed in a reactor chamber held under CVD conditions of temperature and pressure. Apparently, the hydrogen (or atomic hydrogen) reacts with graphite to produce hydrocarbon gas which then decomposes as in a conventional CVD process. Isotopically pure carbon-12 or carbon-13 graphite is used for this method.

Yet another method for forming isotopically-pure single-crystal diamond comprises diffusing isotopically-pure carbon-12 or carbon-13 through a metallic catalyst/solvent under high pressure to a region containing a single crystal substrate to form an isotopically-pure single-crystal diamond layer on said single crystal substrate. The single crystal substrate is stable under the high pressure and elevated temperatures used during the diffusion process. The single crystal substrates optionally may be diamond, including the isotopically-pure single-crystal diamond films formed by the inventive method disclosed herein, thus forming multi-layered diamond structures.

The isotopically pure single-crystal diamond films of the present invention are expected to have high thermal conductivities like diamond synthesized in application Ser. No. 448,469. The expected high thermal conductivity makes the inventive isotopically pure single-crystal diamond film of the present invention ideally suited for use as a heat sink in the production of semi-conductors, repeating stations for fiber optic networks, and like uses.

DETAILED DESCRIPTION OF THE INVENTION

The present invention distinguishes from prior developments such as reported in application Ser. No. 448,469, by directly converting isotopically pure carbon-12 or carbon-13 into isotopically pure single-crystal diamond films rather than producing isotopically pure polycrystalline diamond, comminuting the diamond, and then converting such diamond into isotopically pure single-crystal diamond films. With respect to the CVD method for forming the inventive diamond films disclosed herein, a variety of CVD processes are useful in the present invention and have been conventionally practiced. In these processes, hydrocarbon/hydrogen gaseous mixtures are fed into a CVD reactor as an initial step. Hydrocarbon sources can include the methane series gases, e.g. methane, ethane, propane; unsaturated carbons, ethylene, acetylene, cyclohexene, and benzene; and the like. Methane, however, is preferred. The hydrocarbon sources, unlike the art, are based on isotopically pure carbon-12 or carbon-13, e.g. $^{12}CH_4$. As stated above, isotopically pure $^{12}C$ or $^{13}C$ graphite and hydrogen gas can serve as the source of the hydrocarbon gas. The molar ratio of isotopically pure hydrocarbon to hydrogen broadly ranges from about 1:10 to about 1:1,000, with about 1:100 being preferred. This gaseous mixture optionally may be diluted with an inert gas, e.g. argon. The gaseous mixture is at least partially decomposed thermally by one of several techniques known in the art. One of these techniques involves the use of a hot filament which normally is formed of tungsten, molybdenum, tantalum, or alloys thereof. U.S. Pat. No. 4,707,384 illustrates this process.

It should be noted that suppression of secondary nucleation during the growing of single-crystal diamond layers has been reported to be enhanced by the inclusion of an effective amount of a metallocene or thermal degradation product thereof wherein metal is selected from the class consisting of iron, cobalt, and nickel, as reported in commonly-assigned application Ser. No. 396,253. Metallocenes reported to be useful include, for example, ferrocene, and compounds of nickel such as bis(1-5-cyclooctodiene)nickel, and cobalt such as bis(cyclopentadianyl)cobalt. An effective amount of metallocene is reported to range from about $10^{-4}$ to 1% by volume. Of course, for present purposes, it would be important to use isotopically pure carbon in the ferrocene to avoid contamination of the deposited diamond layer.

The gaseous mixture partial decomposition also can be conducted with the assistance of d.c. discharge or radio frequency electromagnetic radiation to generate a plasma, such as proposed in U.S. Pat. Nos. 4,749,587, 4,767,608, and 4,830,702; and in U.S. Pat. No. 4,434,188 with respect to the use of microwaves.

The substrate used to deposit/grow the single-crystal diamond film is a single crystal material which preferably is single crystal diamond. Other materials suitably lattice matched to diamond additionally should work including, for example, copper/nickel alloys or cubic boron nitride crystals. Epitaxial growth of diamond films can be grown on single crystal substrates as disclosed in commonly-assigned application Ser. No. 479,486, now U.S. Pat. No. 4,981,818.

Regardless of the particular method used in generating the partially decomposed gaseous mixture, the single crystal substrate is maintained at an elevated CVD diamond-forming temperature which typically ranges from about 500° to 1100° C. and preferably in the range of about 850° to 950° C. Pressures in the range of about 0.01 to 1,000 torr, advantageously about 1–800 torr are taught in the art, with reduced pressure being preferred.

In order to avoid contamination of the isotopically pure hydrocarbon, the equipment employed should not contain natural carbon as an impurity. For this purpose, the CVD chamber should be constructed of materials substantially incapable of dissolving carbon. Typical materials of this type are quartz and copper.

As between carbon-12 and carbon-13, the former is highly preferred for various reasons. Carbon-12 is present in nature in a much higher proportion than carbon-13, the latter typically occurring in amounts no higher than about 1% by weight. Thermal conductivity is inversely proportional to the square of the mass number of the isotope, and diamonds prepared from carbon-12, therefore, can be expected to have thermal conductivity of about 17% greater than those prepared from carbon-13.

The thickness of the diamond film deposited on the substrate is not critical. In general, it is convenient to deposit at least as much diamond as will be needed to produce a single crystal of desired size.

In an alternative process for producing single-crystal diamond films, high pressure techniques are employed. Reference is made to *Encyclopedia of Physical Science & Technology*, vol. 6, pp 492–506 (Academic Press, Inc., 1987); Strong, *The Physics Teacher*, January, 1975, pp 7–13; and U.S. Pat. Nos. 4,073,380 and 4,082,185, for general descriptions of these processes. In general, these processes involve the diffusion of carbon as a source material through a liquid bath of a metallic catalyst/solvent at pressures on the order of 50–60 Kbars and temperatures in the range of about 1300°–1500° C. A negative temperature gradient, typically of about 50° C., preferably is maintained between the carbon source material and the deposition region which contains a single crystal substrate on which crystal growth can commence. As in the CVD process, the carbon source material is istopically pure carbon-12 or carbon-13. The same substrates that function under CVD conditions are candidates for use in the high pressure process, though single crystal diamond and cubic boron nitride are preferred.

Catalysts/solvents useful in this high pressure process are known in the art. They include, for example, iron; mixtures of iron with nickel, aluminum, nickel and cobalt, nickel and aluminum, and nickel and cobalt and aluminum; and mixtures of nickel and aluminum. Iron/aluminum mixtures frequently are preferred for the production of single-crystal diamond, with a material consisting of 95wt-% iron and 5 wt-% aluminum being particularly preferred.

Following preparation of the single-crystal diamond film, the substrate can be removed for reuse or the thus-formed diamond film itself can be used as a substrate upon which to deposit additional single-crystal layers of isotopically-pure single-crystal diamond.

In this application, all percentages and proportions are by weight all units are in the metric system, unless otherwise expressly indicated. All citations referred to herein are expressly incorporated herein by reference.

We claim:

1. A method for forming isotopically pure single-crystal diamond films which comprises growing chemical vapor deposition (CVD) single-crystal diamond on a single-crystal substrate directly from isotopically pure carbon-12 or carbon-13.

2. The method of claim 1 wherein said single-crystal diamond is grown from isotopically pure carbon-12.

3. The method of claim 2 wherein said carbon-12 is at least 99.1% isotopically pure.

4. A method for forming isotopically pure single-crystal diamond films which comprises the steps of:
   (a) placing in a reaction chamber a single-crystal substrate heated to an elevated CVD diamond-forming temperature;
   (b) providing a gaseous mixture of hydrogen and a hydrocarbon of isotopically-pure carbon-12 or carbon-13; and
   (c) at least partially decomposing said gaseous mixture in said chamber to form an isotopically-pure single-crystal diamond film on said single-crystal substrate.

5. The method of claim 4 wherein the carbon in the hydrocarbon is carbon-12.

6. The method of claim 5 wherein the carbon-12 in the hydrocarbon is at least 99.1% isotopically pure.

7. The method of claim 4 wherein said gaseous mixture includes an effective amount of a metallocene or thermal degradation product thereof for suppressing secondary nucleation, wherein said metallocene or thermal degradation product thereof is an organic metallic compound of a metal selected from the class consisting of iron, cobalt, and nickel.

8. The method of claim 4 wherein said hydrocarbon is $^{12}CH_4$.

9. The method of claim 4 wherein said single-crystal substrate comprises a single-crystal diamond.

10. The method of claim 9 wherein said single-crystal diamond substrate is of normal isotopic distribution.

11. The method of claim 4 wherein said single-crystal substrate is heated to a temperature ranging from between about 500° and 1100° C. and said gaseous mixture is at least partially decomposed with a filament held at a temperature of at least 1850° C.

12. The method of claim 4 wherein graphite of isotopically pure carbon-12 or carbon-13 and hydrogen gas are placed in said reaction chamber to form said hydrocarbon gas.

* * * * *